United States Patent
Pipkin et al.

(10) Patent No.: US 9,750,135 B2
(45) Date of Patent: Aug. 29, 2017

(54) DUAL FACED ATCA BACKPLANE

(71) Applicant: Tektronix, Inc., Beaverton, OR (US)

(72) Inventors: Ryan L. Pipkin, Prosper, TX (US);
John P. Curtin, Richardson, TX (US);
Yen W. Chang, Wylie, TX (US);
William Kelly, Mesquite, TX (US);
Brian Haarberg, Richardson, TX (US);
Daniel Gray, Richardson, TX (US)

(73) Assignee: NetScout Systems Texas, LLC, Westford, MA (US)

( * ) Notice: Subject to any disclaimer, the term of this patent is extended or adjusted under 35 U.S.C. 154(b) by 585 days.

(21) Appl. No.: 14/105,558

(22) Filed: Dec. 13, 2013

(65) Prior Publication Data

US 2015/0173236 A1 Jun. 18, 2015

(51) Int. Cl.
*H05K 1/14* (2006.01)
*H05K 1/03* (2006.01)
*H05K 7/14* (2006.01)

(52) U.S. Cl.
CPC .......... *H05K 1/038* (2013.01); *H05K 7/1445* (2013.01)

(58) Field of Classification Search
CPC ... H05K 1/11; H05K 1/14; H05K 7/11; H05K 7/14; H05K 7/18; H05K 2201/044; H05K 7/1418; H05K 7/1425; G06F 1/185–1/186
USPC ......................................... 361/788, 796–802
See application file for complete search history.

(56) References Cited

U.S. PATENT DOCUMENTS

| | | | | |
|---|---|---|---|---|
| 5,352,123 A * | 10/1994 | Sample | ............... | H05K 1/14 361/805 |
| 6,392,142 B1 * | 5/2002 | Uzuka | ............... | H05K 1/14 174/541 |
| 6,411,506 B1 * | 6/2002 | Hipp | ............... | G06F 1/189 174/261 |
| 6,608,762 B2 * | 8/2003 | Patriche | ............... | H05K 7/1445 361/788 |
| 8,060,682 B1 * | 11/2011 | Genetti | ............... | G06F 13/4022 370/400 |
| 2003/0007339 A1 * | 1/2003 | Harris | ............... | G02B 6/43 361/788 |
| 2005/0227505 A1 * | 10/2005 | Campini | ............... | G06F 13/4081 439/61 |
| 2007/0121306 A1 * | 5/2007 | Moakes | ............... | H05K 7/1402 361/788 |

* cited by examiner

*Primary Examiner* — Tuan T Dinh
(74) *Attorney, Agent, or Firm* — Locke Lord LLP; Scott D. Wofsy; Christopher J. Capelli (57) ABSTRACT

A system compatible for use with ATCA includes a chassis comprising a first and a second plurality of slots for receiving circuit boards. The chassis further includes a midplane having a front surface and a back surface. The midplane extends between the first plurality of slots and the second plurality of slots. The midplane has a first plurality of connectors affixed to the front surface and has a second plurality of connectors affixed to the back surface. Each connector is arranged to accept a circuit board. The midplane forms an interconnection scheme such that one of the first plurality of slots is directly connected to one of the second plurality of slots. The one of the first plurality of slots and the one of the second plurality of slots extend in opposite directions from their respective connections on the midplane.

19 Claims, 6 Drawing Sheets

DUAL FACED ATCA BACKPLANE

FIELD OF THE INVENTION

Embodiments of the present invention relate to backplane architectures, and particularly to interconnecting a plurality of ATCA compatible circuit boards with a dual faced backplane.

BACKGROUND OF THE INVENTION

In some telecommunication equipment, a plurality of circuit boards (also referred to as blades) may be connected to a common circuit board (also referred to as a backplane). Typically, a backplane includes circuitry for interconnecting the blades. By interconnecting the blades to one another, data may be passed directly from a source blade to one or more destination blades. Some backplanes are designed to comply with one or more standards, such as the Advanced Telecommunications Computer Architecture (ATCA) specification. It is to be appreciated connectivity between blades has become a limiting performance factor in an ATCA system. The central processing units (CPUs) and network processing units (NPUs) have increasing number of cores with each generation. Moreover, the manufacturers are typically adding hardware accelerator functions to improve performance of the CPUs and NPUs even further. As processing power of the blades have increased and with the increase in monitored traffic bandwidth, the backplane connectivity has become one of the primary performance bottlenecks in ATCA systems.

SUMMARY OF THE INVENTION

The purpose and advantages of the illustrated embodiments will be set forth in and apparent from the description that follows. Additional advantages of the illustrated embodiments will be realized and attained by the devices, systems and methods particularly pointed out in the written description and claims hereof, as well as from the appended drawings.

In accordance with a purpose of the illustrated embodiments, in one aspect, a system compatible for use with ATCA is provided. The ATCA compatible system includes a chassis having a first and a second plurality of slots for receiving circuit boards. The chassis further includes a midplane (backplane) having a front surface and a back surface. The midplane extends between the first plurality of slots and the second plurality of slots. The midplane has a first plurality of connectors affixed to the front surface and has a second plurality of connectors affixed to the back surface. Each connector is arranged to accept a circuit board. The midplane forms an interconnection scheme such that one of the first plurality of slots is directly connected to one of the second plurality of slots. The one of the first plurality of slots and the one of the second plurality of slots extend in opposite directions from their respective connections on the midplane.

In another aspect, another embodiment of an apparatus compatible for use with ATCA is provided. The apparatus includes a first and a second plurality of slots for receiving circuit boards. The apparatus further includes a midplane having a front surface and a back surface. The midplane extends between the first plurality of slots and the second plurality of slots. The midplane has a first plurality of connectors affixed to the front surface and has a second plurality of connectors affixed to the back surface. Each connector is arranged to accept a circuit board. The first plurality of slots is connected to the front surface and the second plurality of slots is connected to the back surface. At least some of the circuit boards inserted into the second plurality of slots include switch fabric circuit boards. The midplane forms a hybrid mesh interconnection scheme wherein at least some of the first plurality of slots are directly coupled to the switch fabric circuit boards.

BRIEF DESCRIPTION OF THE DRAWINGS

The accompanying appendices and/or drawings illustrate various, non-limiting, pies, inventive aspects in accordance with the present disclosure.

DETAILED DESCRIPTION OF CERTAIN EMBODIMENTS

The present invention is now described more fully with reference to the accompanying drawings, in which illustrated embodiments of the present invention is shown wherein like reference numerals identify like elements. The present invention is not limited in any way to the illustrated embodiments as the illustrated embodiments described below are merely exemplary of the invention, which can be embodied in various forms, as appreciated by one skilled in the art. Therefore, it is to be understood that any structural and functional details disclosed herein are not to be interpreted as limiting, but merely as a basis for the claims and as a representative for teaching one skilled in the art to variously employ the present invention. Furthermore, the terms and phrases used herein are not intended to be limiting but rather to provide an understandable description of the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, exemplary methods and materials are now described. All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided may differ from the actual publication dates which may need to be independently confirmed.

It must be noted that as used herein and in the appended claims, the singular forms "a", "an," and "the" include plural referents unless the context clearly dictates otherwise. Thus, for example, reference to "a stimulus" includes a plurality of such stimuli and reference to "the signal" includes reference to one or more signals and equivalents thereof known to those skilled in the art, and so forth.

The term "blade" as used herein may refer to a device implemented as a single board, such as a single board computer (SBC) with a processor or controller, a router, a switch, a storage system, a network appliance, a private branch exchange, an application server, a computer/telephony (CT) appliance, and the like.

Figure 1:
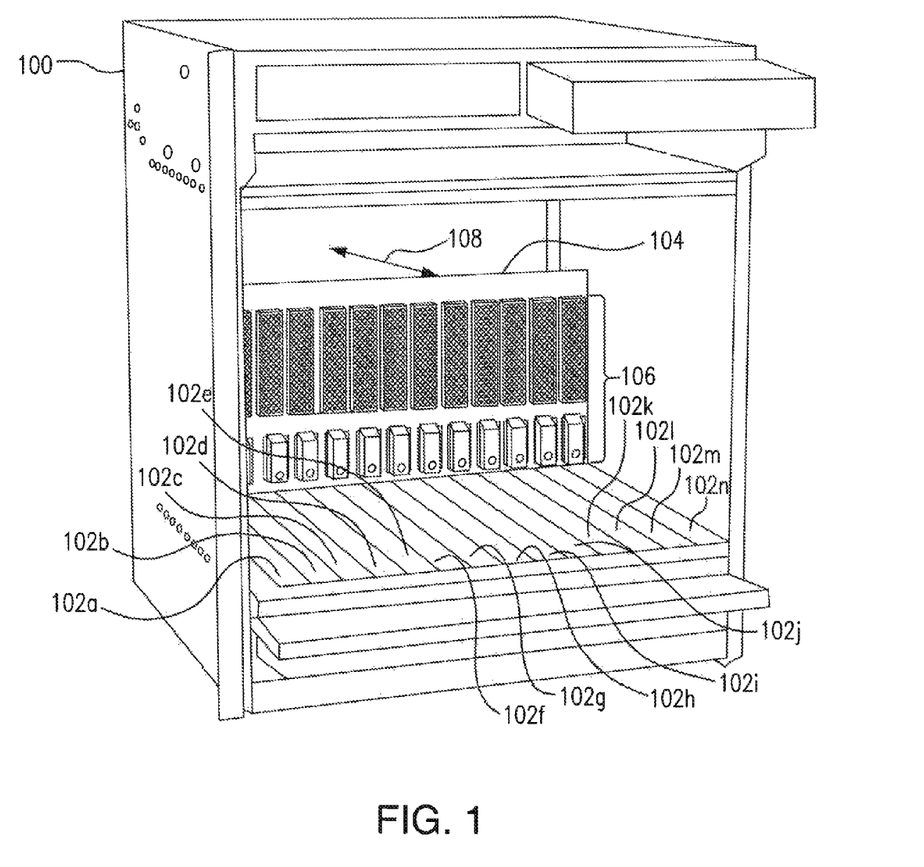
FIG. 1 is a diagram illustrating a conventional chassis that complies with the ATCA specification in accordance with the prior art.

Referring to FIG. 1, a conventional rack-mountable chassis 100 is shown that complies with the Peripheral Component Interconnect (PCI) Industrial Computer Manufacturer Group (PICMG) Advanced Telecommunications Computing Architecture (ATCA). Conventional chassis 100 includes a plurality of slots capable of receiving circuit boards, such as blades, for telecommunication applications. Conventional chassis 100 that comply with ATCA specification typically include fourteen slots 102$a$-$n$. Circuit boards (e.g., blades) may be appropriately placed in each of slots 102$a$-$n$ and operatively connected to a backplane 104 via respective vertical columns of connectors 106 included in the backplane 104. Backplane 104 typically includes circuitry for interconnecting some or all of slots 102$a$-$n$. For example, a blade connected into slot 102$a$ may be interconnected with at least some of the other individual slots 102$b$-$n$ via the circuitry included in backplane 104.

As mentioned above, chassis 100, and in particular backplane 104, may be compliant with the ATCA design specification that is described in PICMG ATCA Base Specification, PICMG 3.0 Rev. 2.0, published Mar. 18, 2005, and/or later versions of the specification ("the ATCA specification"), which are incorporated by reference herein. The ATCA specification defines two types of single circuit boards: Front Board (FRB) and Rear Transition Module (RTM). Initially, RTM modules (not shown in FIG. 1) were mainly expected to provide rear connectivity: the RTM module design was very simple (limited to physical connections routed to connectors). But RTM modules were also a way to customize the features of a FRB, and multiple variants of RTM modules were designed per customer needs. Consequently, each supplier is defining RTM modules per proprietary implementations, which also affects the FRB implementation. However, RTMs do not have direct connectivity to the backplane 104. The RTMs are plugged into the ATCA chassis 100 from its back, and are connected to the corresponding FRB via the Zone 3 connector 310 (shown in FIG. 3). Therefore, the RTMs are dependent upon one or more FRBs. Now, with RTM modules becoming more and more complex and intelligent, there is a business case for providing direct connectivity of RTMs to the backplane 104, because this lack of connectivity limits the functionality of RTMs.

Various embodiments of the present invention advantageously propose rear board access to the backplane 104. These embodiments contemplate that the depth of the rear area 108 of the chassis 100 may be extended so that a full sized FRB could plug into the backplane 104 from the rear. In an embodiment of the present invention, the front and rear boards access the backplane 104 using the same vertical column 106.

Figure 2:
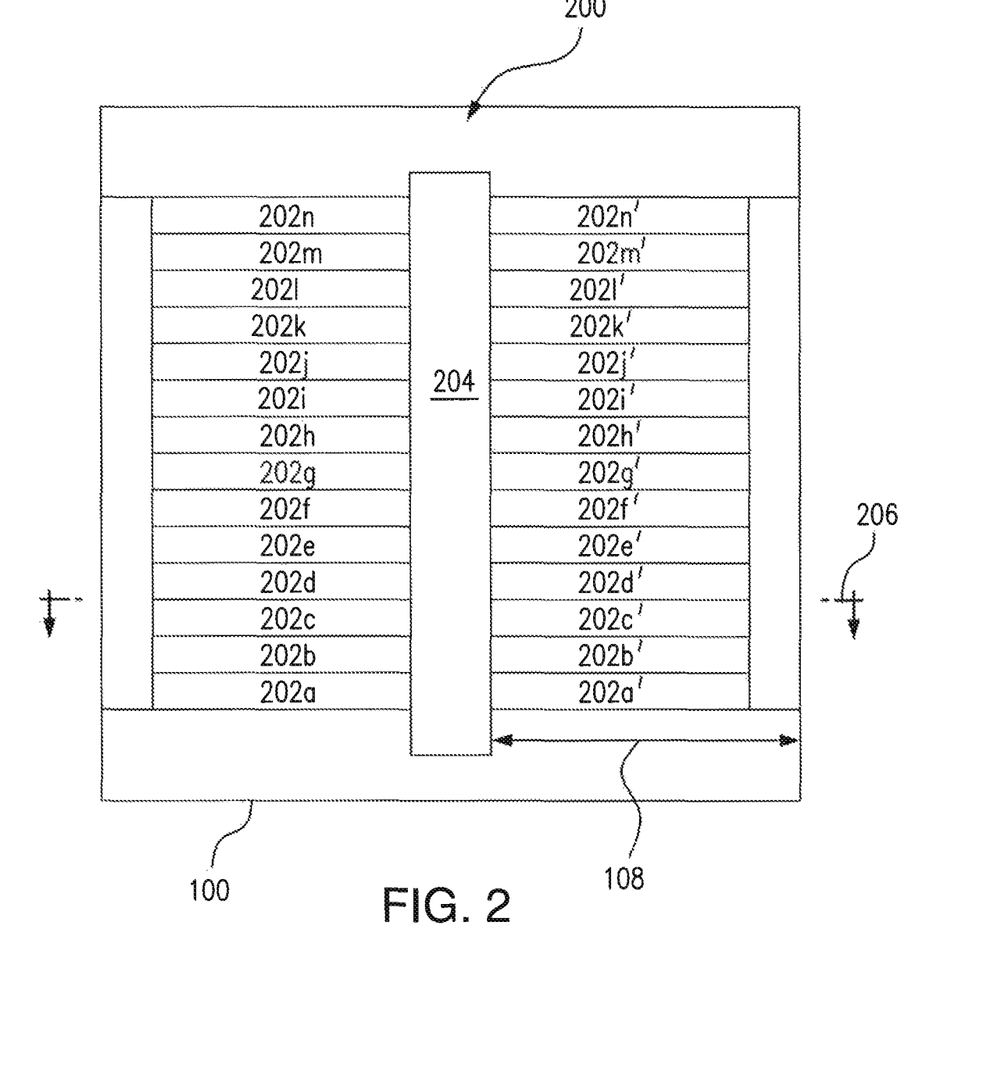
FIG. 2 is a diagrammatic top view of a chassis compatible with ATCA specification, in accordance with an illustrative embodiment of the present invention.

Referring to FIG. 2, a diagrammatic top view 200 of chassis 100 compatible with ATCA specification is shown, in accordance with an illustrative embodiment of the present invention. Top view 200 illustrates an arrangement that takes advantage of the extended depth 108 of the rear area of the chassis 100. Unlike the prior art arrangements, in the architecture of the present invention, a first plurality of slots and a second plurality of slots are interconnected through a special type of backplane referred to hereinafter as midplane 204. A midplane 204, as the name implies, provides connectors on both sides, allowing circuit boards to be connected on both sides of the midplane 204. As shown in FIG. 2, the first plurality of slots (i.e. fourteen slots 102$a$-$n$ shown in FIG. 1) may be populated with a first plurality of ATCA circuit boards (blades) 202$a$-$n$.

In addition, the second plurality of slots may be respectively populated with a second plurality of rear circuit boards 202$a'$-$n'$. Therefore, an illustrated embodiment of the present invention provides a dramatically more dense interconnect capability than the prior art arrangements. Advantageously, midplane 204 provides access to fourteen front circuit boards 202$a$-$n$ and fourteen rear boards 202$a'$-$n'$. According to an aspect of the present invention, the corresponding front 202$a$-$n$ and rear boards 202$a'$-$n'$ access the midplane 204 in the same vertical column of connectors 106. The conductive paths, which are also referred to as "signal traces", interconnect and provide communication between the circuit boards populated in the chassis 100. It is noted that the midplane 204 can route signals between circuit boards connected on the same side of the midplane 204 (e.g., blades 202$a$-$n$) or can cross-connect a front board 202$a$-$n$ on one side of the midplane 204 with a rear board 202$a'$-$n'$ on the other side of the midplane 204.

Figure 3:
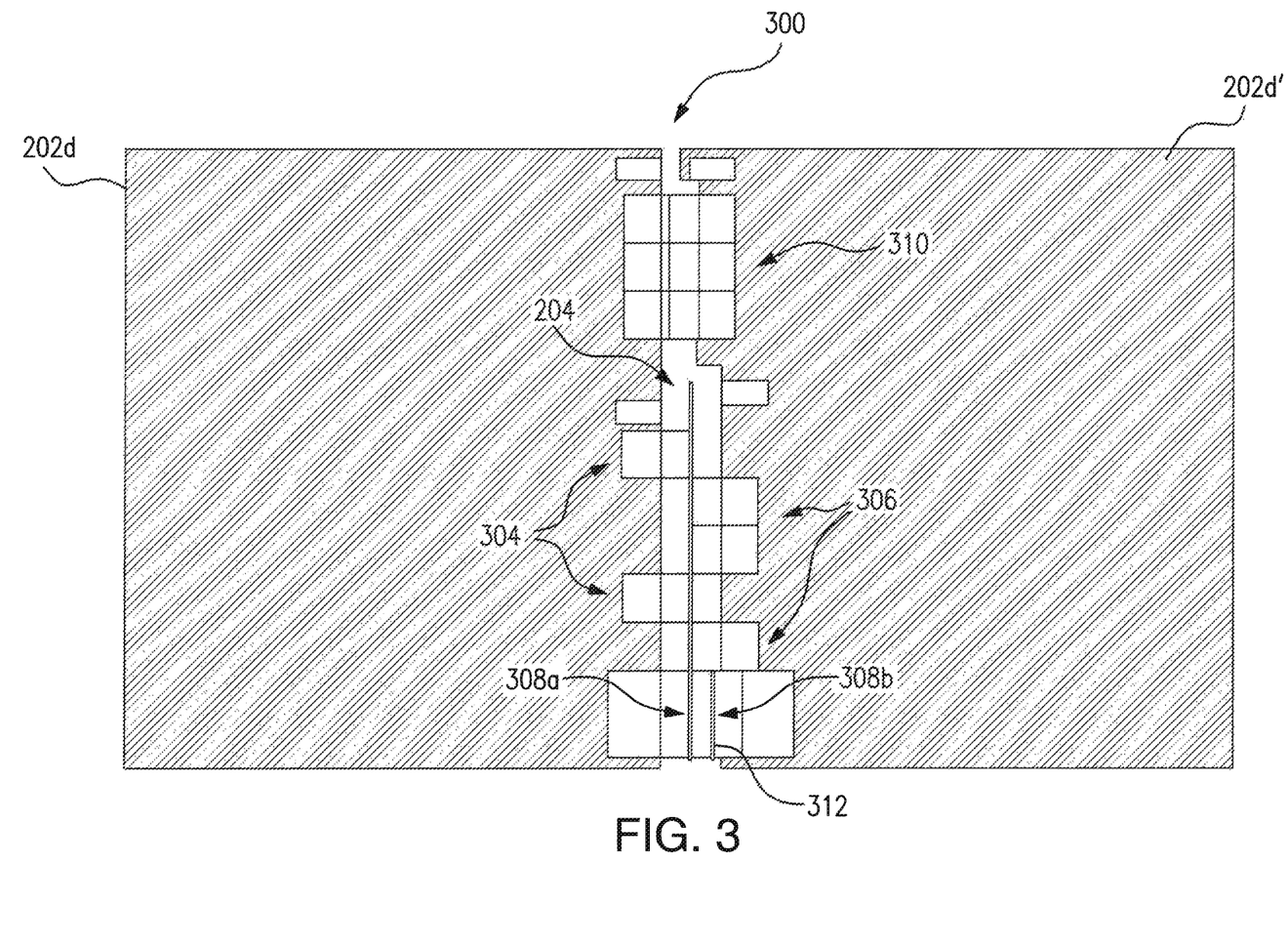
FIG. 3 is a cross-sectional view of circuit boards of FIG. 2 having direct access to the midplane, in accordance with an illustrative embodiment of the present invention.

Referring to FIG. 3, an interior cross-sectional view 300 of chassis 100 is shown as cut along an axis 206 of FIG. 2. As illustrated in cross-sectional view 300, each board 202$d$ and 202$d'$ may be connected to midplane 204 via multiple connectors affixed on opposite sides of the midplane 204. In standard ATCA environments, the connectors in each vertical column 106 are divided into three zones: Zone 1, Zone 2, and Zone 3. According to an embodiment of the present invention, the Zone 1 connectors 308$a$-$b$, located on opposite sides of the midplane 204, provide power and management plane signals from midplane 204 to the respective front 202$d$ and rear boards 202$d'$. As shown in FIG. 3, the Zone 1 connector 308$a$ is mounted to the front surface of the midplane 204 for front boards 202$a$-$n$ (i.e., front board 202$d$). However, according to an embodiment of the present invention, the corresponding Zone 1 connector 308$b$ for rear boards 202$a'$-$n'$ (i.e., rear board 202$d'$) may be mounted on a separate power backplane 312. It should be noted that the respective Zone 1 connectors 308$a$-$b$ cannot be mounted to both sides of the midplane 204 due to interference between the connectors 308$a$-$b$. Further, the Zone 1 connectors 308$a$-$b$ may be chosen to be compatible with any input power signal, such as different input voltages. For example, the Zone 1 connectors 308$a$-$b$ may accept −48V DC.

In a conventional ATCA system, the Zone 3 connectors 310 are used for user-customized connections. For example, as previously indicated, RTMs are plugged into the ATCA chassis 100 from its back, and are connected to the corresponding FRB via the Zone 3 connector 310. It is noted that while Zone 3 connectors 310 provide direct front to rear connectivity between the front board 202$d$ and rear board 202$d'$, these connectors are not communicatively coupled to the midplane 204. In other words, a connector 310 does not allow data to be passed between, for example, front board 202*d* and the other front boards 202*a-c* and 202*e-n* and/or rear boards 202*a'-c'* and 202*e'-n'*, respectively.

In standard ATCA systems the Zone 2 connectors provide the FRBs with control plane signal, data plane signal and clock signal. More specifically, Zone 2 defines the use of five backplane connectors, P20 through P24, to support a data transport interface. It provides for up to five connectors per FRB to cover the base interface, fabric interface, update channel interface, and synchronization clock interface. However, typically most ATCA systems utilize only connectors P20 and P23 for data transport, because typically FRBs utilize two fabric channels which require only two connectors.

According to an embodiment of the present invention, the midplane 204 has a first plurality of connectors affixed to the front surface and has a second plurality of connectors affixed to the back surface. As shown in an exemplary arrangement of FIG. 3, the first plurality of connectors 304 includes conventional connectors P20 and P23, which remain attached to the front surface of the midplane 204. However, the portion of the midplane typically occupied by connectors P21, P22, and P24 in a conventional ATCA backplane is utilized from the opposite side of the midplane 204, according to an embodiment of the present invention. As shown in FIG. 3, the second plurality of connectors 306 may include connectors P26, P27, and P28, which are affixed to the back surface of the midplane 204. Advantageously, the rear boards, such as board 202*d'*, may use the second plurality of connectors 306 to access the midplane 204 directly. It is noted the first plurality of connectors 304 and the second plurality of connectors 306 are substantially the same and preferably are configured support one or more data transport interfaces. However, the second plurality of connectors 306 is rotated approximately 180 degrees with respect to the front surface of the midplane 204. Further still, the arrangement of first plurality of connectors 304 and second plurality of connectors 306 is not limited to the geometry shown in FIG. 3, but may include any geometry and arrangement between the front and back surfaces of the midplane 204, as long as all five connectors utilize substantially the same portion of the midplane 204 as connectors P20-P24 in a standard ATCA system.

The design illustrated in FIG. 3 has several advantages over the conventional ATCA backplane design. First, both the front circuit board 202*d* and rear circuit board 202*d'* are operatively coupled to the midplane 204 utilizing the same vertical column of connectors (such as column 106 shown in FIG. 1). Second, both the first plurality of connectors 304 and the second plurality of connectors 306 occupy substantially the same portion of the midplane 204 as conventional Zone 2 ATCA compliant connectors. The architectural design shown in FIG. 3 allows the rear circuit board 202*d'* to access the midplane 204 without requiring the use of additional backplane real estate. Thus, the midplane 204 can support fourteen vertical columns of connectors capable of providing access to the midplane to both the first plurality of circuit boards 202*a-n* and the second plurality of circuit boards 202*a'-n'*, which extend in opposite directions from their respective connections on the midplane 204.

Figure 4:
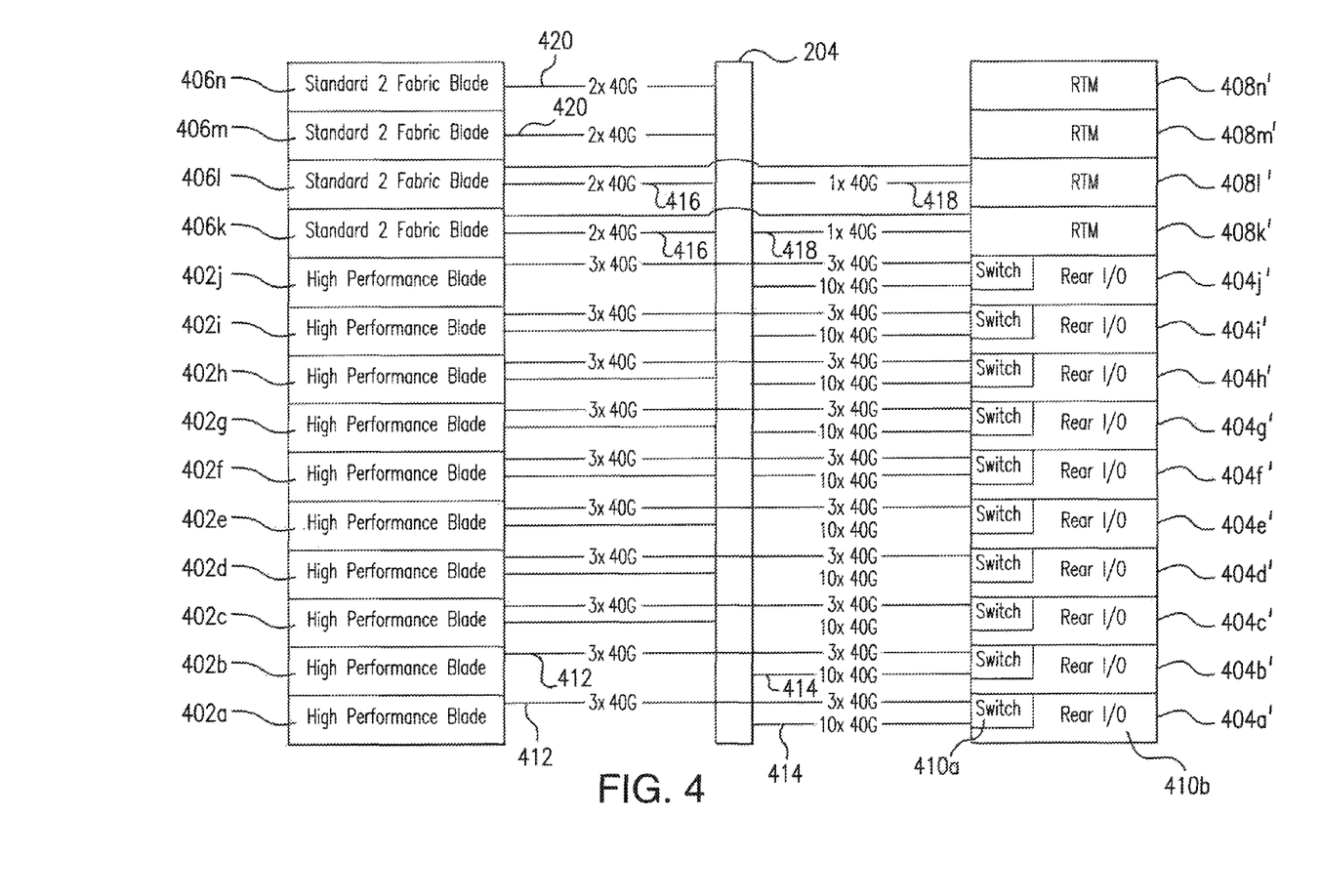
FIG. 4 shows one possible implementation of connection fabric, in accordance with an illustrative embodiment of the present invention.

FIG. 4 illustrates one exemplary implementation of connection fabric, in accordance with an illustrative embodiment of the present invention. FIG. 4 depicts an ATCA compatible system where midplane 204 supports twenty-eight slots, at least some of which are utilized for a switching fabric. It is noted that availability of twenty-eight slots connected to the midplane 204, as compared to only fourteen slots in a standard ATCA configuration, provides a highly configurable architecture for optimizing performance of an ATCA compliant system. For example, in the implementation illustrated in FIG. 4, the ten rear circuit boards 404*a'-j'* operatively coupled to the midplane 204 may each include a corresponding module 410*a* of the switch fabric. In addition to switch modules, each of the rear boards 404*a'-j'* may be configured to include an Input/Output (I/O) interface 410*b*. Thus, as shown in FIG. 4, the plurality of switch modules 410*a* may reside on the rear circuit boards(blades) 404*a'-j'*. This configuration advantageously frees up space and power on the FRBs for processing functions. For example, as shown in FIG. 4, the slots that are positioned directly opposite to the ten rear circuit boards 404*a'-j'* containing switch modules may be occupied by ten high performance blades 402*a-j*. In an embodiment of the present invention, the high performance blades 402*a-j* may represent circuit boards with multi-processor architectures and multi gigabytes of on-board memory.

Each of the rear circuit boards (blades) 404*a'-j'* housing switching fabric 410*a* may have thirteen distinct data transmission channels (paths) that connect to the midplane 204 operating at 40 Gbps. In an embodiment shown in FIG. 4, three of these channels 412 provide a direct connection between the front circuit boards, i.e. high performance blades 402*a-j*, and the rear circuit boards 404*a'-j'*. This architecture advantageously provides a dedicated low latency and substantially guaranteed bandwidth data passing path between the rear I/O interface modules 410*b* and the corresponding high performance blades 402*a-j* situated on the opposite side of the midplane 204. In addition, nine of the ten 40 Gbps data transmission channels 414 shown in FIG. 4 may preferably provide interconnect paths through the midplane 204 for all ten circuit boards 404*a'-j'* containing switching fabric 410*a*, thus effectively creating a mesh topology, as discussed below. The remaining one of the ten channels 414 may be used for user-customized connections. For instance, this channel may connect a particular rear circuit board to another front circuit board, such as FRBs 406*k-n*. Alternatively, this data transmission channel may provide a direct path between a particular rear circuit board 404*a'-j'* accommodating switching fabric 410*a* and one of the RTM modules 408*k'-n'*, which may also extend from the back surface of the midplane 204. As shown in FIG. 4, at least some of the RTM modules 408*k'-n'* may have at least one channel connection 418 to the midplane 204 operating at 40 Gbps. Similarly, at least some of the FRBs 406*k-n* may be operatively coupled via at least two channel connections 416, 420 to the midplane 204.

As previously indicated, to pass data among twenty-eight slots shown in FIG. 4, one or more interconnection schemes may be incorporated into midplane 204. The conventional ATCA backplane as defined by the ATCA specification supports up to a 40 Gbps bandwidth full mesh interconnection scheme between circuit boards in a chassis. The full mesh interconnection scheme contemplates that each circuit board on either side of midplane 204 may be directly connected to each of the other boards. For example, high performance blade 402*g* may be directly operatively coupled to each of the other circuit boards 402*a-f*, 402*h-j*, 404*a'-j'*, 406*k-n* and 408*k'-n'*. Thus, for the embodiment of twenty-eight slots shown in FIG. 4, twenty-seven connections should be associated with each slot in order to provide a dedicated connection for each pair of slots. It is noted that standard full mesh backplane, as defined by the ATCA specification, supports a direct connection between any two boards in the chassis 100 operating at 40 Gbps. Thus, considerable hardware may be needed at each slot to produce the full mesh. For example, to implement the full mesh in this twenty-eight slot embodiment, each circuit board should include a twenty-seven position switch for establishing a connection between the circuit board (where the switch fabric is located) and each of the other circuit boards. This hardware may substantially increase the development and production cost of the midplane 204.

Another disadvantage of a full mesh topology implementation in a twenty-eight slot system is that it is typical for a standard off-the-shelf ATCA circuit board to support only the first two fabric channels. Thus, in a full mesh topology the circuit boards that only implement the first two fabric channels all connect to the same two slots in the system. This configuration concentrates the bandwidth to particular node slots instead of having the bandwidth distributed among all slots in the chassis.

Two other well-known interconnection schemes include a dual star and a dual dual star configurations. In a dual star topology all slots are connected with a star on which a fabric switch is placed. A second switching module (dual) assures the redundancy. In other words, with dual star implementation all slots communicate with each other via the switching modules in the hub slots. At a higher demand of power a second group with two redundant switches can be added so that a dual dual star configuration can be created. The well-known drawbacks for the dual star and dual dual star configurations include the backplane connectivity to only two (or four) hub slots in the chassis. These interconnection schemes require dedicated hub blades, which decrease the number of slots available for processing in the ATCA compatible system. Moreover, the hub slots always act as a hop between any 2 circuit boards in the system, effectively creating additional latency and bandwidth restrictions.

Figure 5:
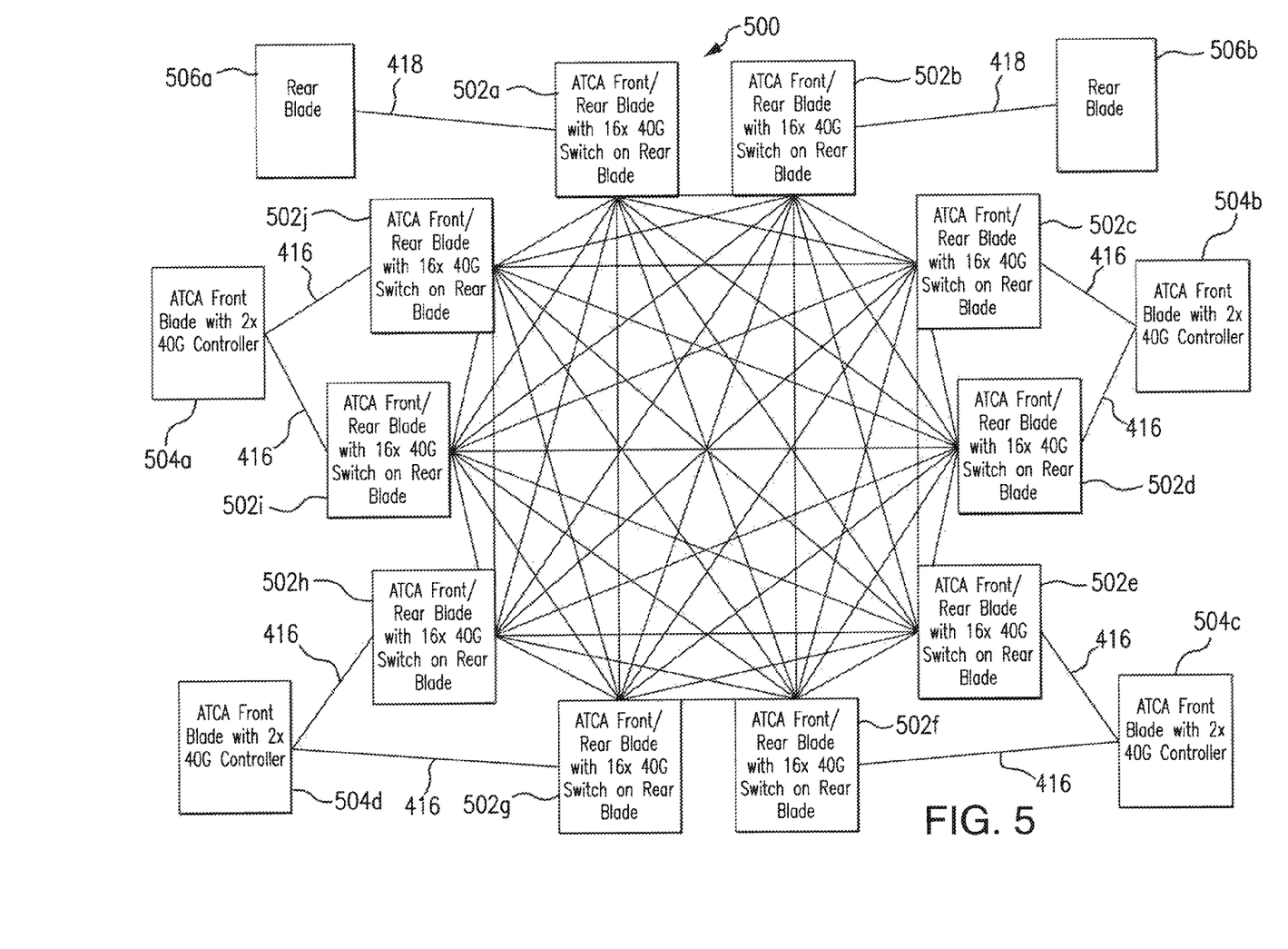
FIG. 5 is a representation of a hybrid mesh topology for interconnecting the slots of the chassis of FIG. 2, in accordance with an illustrative embodiment of the present invention.

Referring to FIG. 5, a graphical representation is presented of a hybrid mesh topology interconnection scheme 500. The hybrid mesh scheme 500 comprises a combination of the full mesh and dual star topologies in the same system. This scheme overcomes the expense of supporting a full mesh and overcomes the limitations of the dual star topology. The hybrid mesh interconnection scheme 500 does not require the FRBs in the system to include switch fabric 410*a*. It is noted that the principles of the hybrid mesh interconnection scheme 500 for the ATCA compatible system are explained with reference to FIGS. 4 and 5.

In the graphical representation of FIG. 5 each of the inner nodes 502*a-j* represent a pair of corresponding circuit boards positioned on opposite sides of midplane 204 directly across from each other. For example, node 502*a* in FIG. 5 represents the pair comprising the high performance blade 402*a* and a corresponding rear circuit board 404*a'*, node 502*b* represents the pair comprising the high performance blade 402*b* and a corresponding rear circuit board 404*b'*, and so forth. In an embodiment shown in FIG. 4, three of the channels 412, provide a direct connection between the front circuit boards, i.e. high performance blades 402*a-j*, and the rear circuit boards 404*a'-j'* housing switching fabric 410*a*. These rear circuit boards 404*a'-j'* are interconnected via channels 414 (shown in FIG. 4) through the midplane 204 to create a full mesh within those ten slots. Thus, effectively each pair 502*a-j* collectively has thirteen dedicated channels 412, 414 operating, for example, at 40 Gbps.

The outer four nodes 504*a-d* in FIG. 5 represent FRBs 406*k-n* shown in FIG. 4. Each of the FRB s 504*a-d* have two dedicated channels 416 that are distributed to eight different rear circuit boards 404*a'-j'* (represented by 502*c-j* in FIG. 5). For example, FRB 406*k* represented by node 504*a* in FIG. 5 may be interconnected with nodes 502*i* and 502*j* representing, for example, rear circuit boards 404*i'* and 404*j'*, respectively, FRB 406*l* represented by node 504*b* in FIG. 5 may be interconnected with nodes 502*c* and 502*d* representing, for example, rear circuit boards 404*c'* and 404*d'*, respectively, and so forth. It should be noted that in FIG. 5 eight different channels 416 represent both dedicated channels 416 and 420 shown in FIG. 4.

Nodes 506*a* and 506*b* in FIG. 5 represent two rear circuit boards (RTMs) 408*k'* and 408*l'* that have a single 40 Gbps channel 418 routed to them. It is noted that slots occupied by rear circuit boards 408*m'* and 408*n'* do not have fabric connectivity and therefore these circuit boards are not shown in FIG. 5.

In summary, the hybrid mesh design 500 illustrated in FIG. 5 creates a new topology that comprises a combination of two well-known topologies, specifically, full mesh and dual star topologies. The hybrid mesh interconnection scheme 500 creates connectivity within an ATCA compatible system that is cost-effective while maximizing processing capabilities of the FRBs 402*a-j* and 406*k-n*. For example, the hybrid mesh interconnection scheme 500 allows all fourteen FRBs 402*a-j* and 406*k-n* to comprise purely processing boards, thus increasing processing power of the system. In addition, since each of the corresponding fabric channels 412, 416 are distributed through the midplane 204 to one of the switch fabric modules 410*a* accommodated by the rear circuit boards 404*a'-j'*, FRBs 402*a-j* and 406*k-n* are not required to support the full switching overhead that a full mesh design would require. Another advantage of the hybrid mesh interconnection scheme 500 is that I/O data provided by one of the I/O interface modules 410*b* in the rear circuit board 404*a'*, for example, may be passed through one of the dedicated channels 412 to the FRB 402*a* directly connected to the rear circuit board 404*a'* effectively bypassing the mesh. Bypassing the mesh provides a low latency path and dedicated bandwidth between the I/O interface 410*b* and the high performance blade 402*a* that performs corresponding processing of data.

Figure 6:
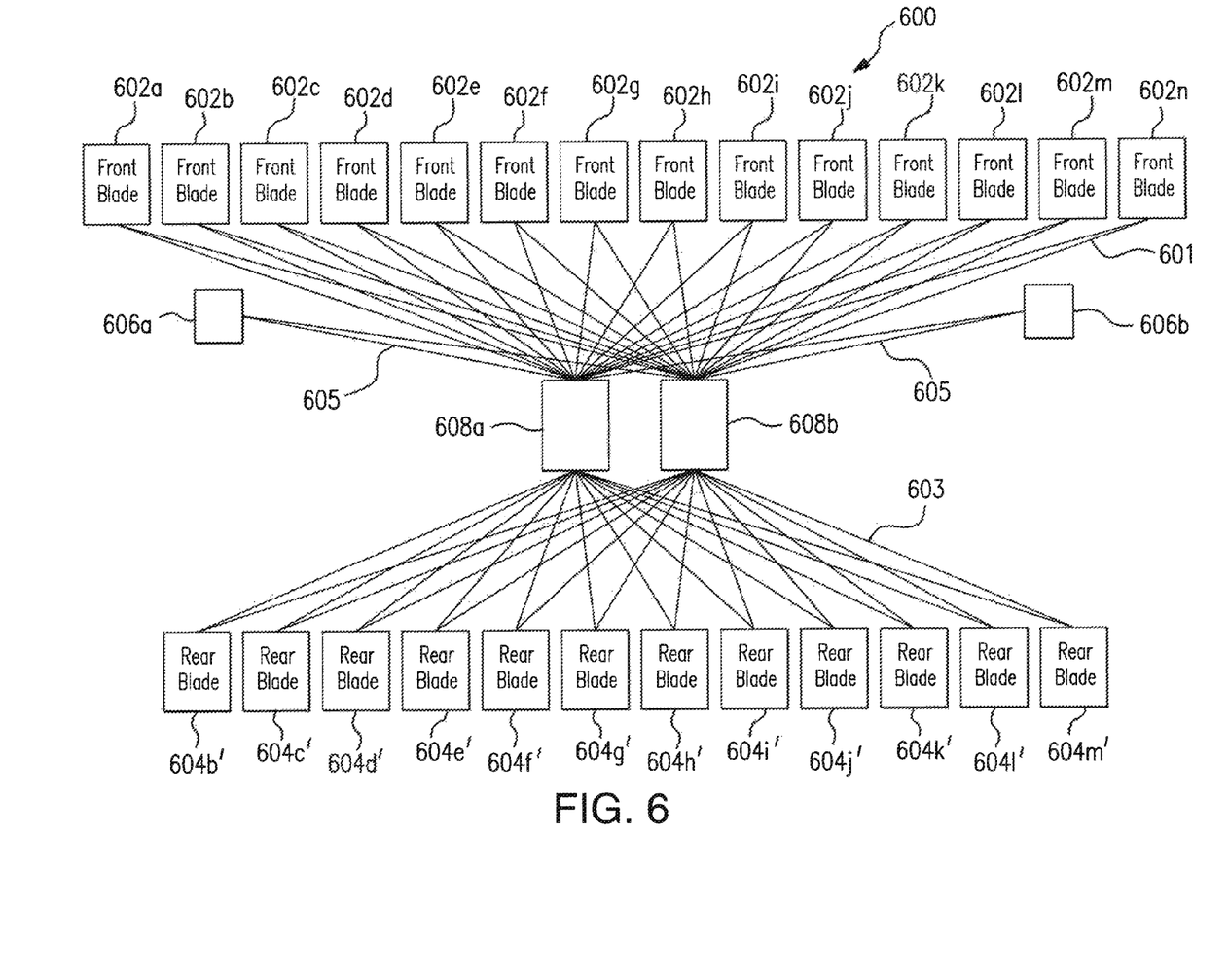
FIG. 6 is a representation of a base interface interconnection, in accordance with an illustrative embodiment of the present invention.

FIG. 6 is a graphical representation of a base interface interconnection scheme 600 configured in a dual-star topology, in accordance with an illustrative embodiment of the present invention. The base interface is commonly used for out of band management, firmware uploading, operating system boot, and the like. According to the ATCA specification, a base interface is typically configured to support 10/100/1000 BASE-TX Ethernet connection links between boards in the chassis. Referring back to FIG. 6, fourteen blades 602*a-n* are shown that may be inserted into slots connected to the front surface of midplane 204. FIG. 6 also illustrates twelve blades 604*b'-m'* that may be inserted into slots connected to the back surface of midplane 204.

In this example, blade 608*a*, which may be inserted into one of the rear slots, is depicted as a hub/switch module. Accordingly, at least a portion of the data, in this dual-star example, is forwarded through module 608*a* and then to other blades 602*a-n* and 604*b'-m'* that are communicatively coupled to midplane 204. Also, as part of the dual-star topology, a second hub/switch module 608*b* may be received in another rear slot. The second hub/switch module 608*b*, for example, provides redundant and/or load-balancing switch capabilities to the ATCA compatible modular platform chassis 100.

Presently, communication links at more than 1 gigabit per second (also commonly referred to as "1 G") are quite common. Standards for communicating at 1 G are well established. For instance, the Gigabit Ethernet standard has been available for some time, and specifies standards for communicating using Ethernet technology at the rate of 1 G and higher. Currently, the 1 G Ethernets include two kinds, such as 1000BASE-T using a CAT5e cable with an RJ45 connector (an unshielded twisted pair cable) as the communication cable, and 1000 BASE-X using an optical fiber or an STP cable (a shielded twisted pair cable), any of which can be used in various embodiments. Accordingly, in one embodiment of the present invention, the plurality of front blades 602a-n may be communicatively coupled with hub/switch modules 608a-b using 1 G interface and 1000Base-T connection links 601, while the plurality of rear blades 604b'-m' may be communicatively coupled with hub/switch modules 608a-b using 1 G interface and 1000Base-X connection links 603. Further, broadband network technologies other than the 1 G Ethernet, such as FiberChannel, SDH (Synchronous Digital Hierarchy)/SONET (Synchronous Optical NETwork) and so on may be used in various embodiments of the present invention.

The dual-star base fabric topology 600 may further include shelf managers 606a-b to perform manageability functions for the chassis. In this embodiment, the shelf managers 606a-b may be implemented in software or firmware, or a combination of both. Shelf managers 606a-b may be capable of performing one or more manageability functions with respect to hub/switch modules 608a-b. The shelf managers 606a-b, in this embodiment, may be location independent, and may therefore be located in any of the blades 602a-n and 604b'-m' or may be external to the chassis 100. Shelf managers 606a-b may be capable of communicating with one or more hub/switch modules 608a-b, via, for example, 100 M Interface connection links 605.

Various embodiments of the present invention provide a flexible, cost effective, and vendor agnostic solution framework for improving performance and current throughput demands of ATCA compatible systems. In one aspect, various embodiments of the present invention take unique approach of providing rear board access to the midplane to improve capacity of the system. In another aspect, various embodiments of the present invention present a novel interconnection scheme, referred to as a hybrid mesh, which enables efficient transfer of data within the ATCA compatible system.

As will be appreciated by one skilled in the art, aspects of the present invention may be embodied as a system or computer program product. Accordingly, aspects of the present invention may take the form an embodiment combining software and hardware aspects that may all generally be referred to herein as a "module" or "system." Furthermore, aspects of the present invention may take the form of a computer program product embodied in one or more computer readable medium(s) having computer readable program code embodied thereon.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system compatible for use with an Advanced Telecommunications Computing Architecture (ATCA) comprising:
 a chassis comprising:
 a first plurality of slots for receiving ATCA circuit boards;
 a second plurality of slots for receiving circuit boards; and
 a midplane having a front surface and a back surface, the midplane extending between the first plurality of slots and the second plurality of slots, the midplane having a first plurality of connectors affixed to the front surface and having a second plurality of connectors affixed to the back surface, each connector of the first and second plurality of connectors arranged to accept a circuit board and used for data transport,
 wherein the midplane forms an interconnection scheme such that one of the first plurality of slots is directly and operatively connected to one of the second plurality of slots, such that the first plurality of connectors and the second plurality of connectors access the midplane in a same substantially vertical column, and wherein the one of the first plurality of slots and the one of the second plurality of slots extend in opposite directions from their respective connections on the midplane,
 wherein the midplane is used for data transport between connectors of the second plurality of connectors and for data transport between a connector of the first plurality of connectors and a connector of the second plurality of connectors when, of the ATCA circuit boards and the circuit boards received by the first and second plurality of slots, only at least a portion of the circuit boards received by the second plurality of slots include a switch fabric that is coupled to the midplane, and
 wherein the first plurality of connectors comprises two first connectors and wherein the second plurality of connectors comprises three second connectors, the two first connectors and three second connectors are configured to use a substantially similar portion of the midplane as a standard ATCA configuration.

2. The system of claim 1, wherein the first plurality of connectors and the second plurality of connectors are arranged substantially vertically.

3. The system of claim 1, wherein the first plurality of slots comprises fourteen slots and wherein the second plurality of slots comprises fourteen slots.

4. The system of claim 1, wherein the one of the first plurality of slots is directly connected to one of the second plurality of slots by at least three data transmission channels.

5. The system of claim 1, wherein a plurality of switch fabric circuit boards are inserted within at least some of the second plurality of slots extending from the back surface of the midplane.

6. The system of claim 1, wherein the first plurality of connectors and the second plurality of connectors are supported one or more data transport interfaces.

7. The apparatus of claim 1, wherein a second slot of the second plurality of slots couples with a switch fabric circuit of a circuit board received in the second slot to pass data between an I/O interface of the circuit board and an ATCA circuit board inserted in first slot of the first plurality of slots that is directly connected to the switch fabric circuit inserted in the second slot.

8. The system of claim 5, wherein each of the plurality of switch fabric circuit boards are connected to the midplane by a plurality of data transmission channels.

9. The system of claim 6, wherein the one or more data transport interfaces include a base fabric interface.

10. An apparatus compatible for use with an Advanced Telecommunications Computing Architecture (ATCA) comprising:
- a first plurality of slots for receiving ATCA circuit boards;
- a second plurality of slots for receiving circuit boards; and
- a midplane having a front surface and a back surface, the midplane extending between the first plurality of slots and the second plurality of slots, the midplane having a first plurality of connectors affixed to the front surface and having a second plurality of connectors affixed to the back surface,
- each connector of the first and second plurality of connectors is arranged to accept a circuit board and used for data transport such that the first plurality of slots is connected to the front surface and the second plurality of slots is connected to the back surface,
- wherein the first plurality of connectors and the second plurality of connectors access the midplane in a same substantially vertical column,
- wherein at least some of the second plurality of slots are coupled with a switch fabric circuit board inserted therein,
- wherein the midplane forms a hybrid mesh interconnection scheme,
- wherein at least some of the first plurality of slots are directly coupled to the inserted switch fabric circuit boards,
- wherein the midplane is used for data transport between connectors of the second plurality of connectors and for data transport between a connector of the first plurality of connectors and a connector of the second plurality of connectors when, of the ATCA circuit boards and the circuit boards received by the first and second plurality of slots, only at least a portion of the circuit boards received by the second plurality of slots include a switch fabric that is coupled to the midplane, and
- wherein the first plurality of connectors comprises two first connectors and wherein the second plurality of connectors comprises three second connectors, the two first connectors and three second connectors are configured to use a substantially similar portion of the midplane as a standard ATCA configuration.

11. The apparatus of claim 10, wherein the hybrid mesh interconnection scheme comprises a combination of a full mesh topology and a dual star topology.

12. The apparatus of claim 10, wherein the hybrid mesh interconnection scheme comprises interconnections for interconnecting ten switch fabric circuit boards with each other in a full mesh topology when ten switch fabric circuit boards are inserted into the second plurality of slots.

13. The apparatus of claim 10, wherein the at least some of the first plurality of slots are directly coupled to the switch fabric circuit boards by at least three data transmission channels.

14. The apparatus of claim 10, wherein the first plurality of connectors and the second plurality of connectors are supported one or more data transport interfaces.

15. The apparatus of claim 10, wherein a second slot of the second plurality of slots couples with a switch fabric circuit of a circuit board received in the second slot to pass data between an I/O interface of the circuit board and an ATCA circuit board inserted in first slot of the first plurality of slots that is directly connected to the switch fabric circuit inserted in the second slot.

16. The apparatus of claim 12, wherein the hybrid mesh interconnection scheme comprises ten circuit boards inserted into ten slots of the first plurality of slots arranged in opposite direction from the ten switch fabric circuit boards and wherein each of the ten circuit boards is directly connected to a corresponding one of the ten switch fabric circuit boards via a plurality of fabric channels.

17. The apparatus of claim 14, wherein the one or more data transport interfaces include a base fabric interface.

18. The apparatus of claim 16, wherein the hybrid mesh interconnection scheme comprises four circuit boards inserted into four slots of the first plurality of slots, wherein each of the four circuit boards is directly connected to a distinct pair of the ten switch fabric circuit boards.

19. The apparatus of claim 18, wherein the hybrid mesh interconnection scheme comprises two circuit boards inserted into two slots of the second plurality of slots, wherein each of the two circuit boards is directly connected to at least one of the ten switch fabric circuit boards.

* * * * *